(12) United States Patent
Wadhwa et al.

(10) Patent No.: US 7,965,117 B2
(45) Date of Patent: Jun. 21, 2011

(54) CHARGE PUMP FOR PHASE LOCKED LOOP

(75) Inventors: Sanjay K. Wadhwa, Noida (IN); Krishna Thakur, Greater Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 72 days.

(21) Appl. No.: 12/436,153

(22) Filed: May 6, 2009

(65) Prior Publication Data

US 2010/0283517 A1 Nov. 11, 2010

(51) Int. Cl.
*H03L 7/06* (2006.01)
(52) U.S. Cl. .......................... 327/157; 327/148
(58) Field of Classification Search .................. 327/148, 327/157
See application file for complete search history.

(56) References Cited

U.S. PATENT DOCUMENTS

| | | | |
|---|---|---|---|
| 3,723,895 A * | 3/1973 | Peil | 330/254 |
| 5,508,660 A | 4/1996 | Gersbach et al. | |
| 6,657,477 B2 * | 12/2003 | Hughes | 327/534 |
| 6,784,707 B2 * | 8/2004 | Kim et al. | 327/158 |
| 6,894,569 B2 | 5/2005 | Fayneh et al. | |
| 7,176,733 B2 * | 2/2007 | Haerle | 327/157 |
| 7,253,686 B2 * | 8/2007 | Ali | 330/259 |
| 7,408,391 B2 * | 8/2008 | Haerle | 327/157 |
| 7,528,648 B2 * | 5/2009 | Raimar | 327/543 |
| 7,616,035 B2 * | 11/2009 | Haerle | 327/157 |
| 7,688,122 B2 * | 3/2010 | Nedovic | 327/157 |
| 7,701,270 B2 * | 4/2010 | Wyatt et al. | 327/157 |
| 7,705,640 B2 * | 4/2010 | Clements et al. | 327/157 |
| 2002/0163380 A1 * | 11/2002 | Hughes | 327/552 |
| 2004/0008063 A1 * | 1/2004 | Kim et al. | 327/158 |
| 2007/0080729 A1 * | 4/2007 | Haerle | 327/157 |
| 2007/0164811 A1 * | 7/2007 | Crippa et al. | 327/541 |
| 2008/0252342 A1 * | 10/2008 | Haerle | 327/157 |
| 2009/0121760 A1 * | 5/2009 | Haerle | 327/157 |
| 2009/0201058 A2 * | 8/2009 | Haerle | 327/157 |
| 2010/0079127 A1 * | 4/2010 | Grant | 323/285 |
| 2010/0127739 A1 * | 5/2010 | Ebuchi et al. | 327/148 |

* cited by examiner

*Primary Examiner* — Lincoln Donovan
*Assistant Examiner* — Adam D Houston
(74) *Attorney, Agent, or Firm* — Charles Bergere

(57) ABSTRACT

A charge pump includes a charge pump core circuit having a first current source transistor, a second current source transistor and an output terminal (64), and a replica bias circuit. The replica bias circuit has a first reference current source transistor, a second reference current source transistor and a reference node corresponding to the output terminal of the charge pump core circuit. The reference node is connected to gates of the second current source transistor and the second reference current source transistor. A first input of a regulator circuit is connected to the output terminal of the charge pump core circuit. A second input of the regulator circuit is connected to the reference node of the replica bias circuit. An output of the regulator circuit (54) is connected to gates of the first current source transistor and the first reference current source transistor.

15 Claims, 2 Drawing Sheets

CHARGE PUMP FOR PHASE LOCKED LOOP

BACKGROUND OF THE INVENTION

The present invention relates generally to charge pump circuits and more particularly to a charge pump circuit for a phase locked loop (PLL).

Charge pump circuits are employed in phase locked loops (PLLs) to tune a voltage-controlled oscillator (VCO) in response to phase error information detected by a phase-frequency detector.

Current mismatch is known to occur in such charge pump circuits when the PLL is in a phase-locked state. The current mismatch creates a skew or phase offset and reference frequency spurs in the output of the PLL. The skew in the output of the PLL is undesirable in synchronous systems as it consumes a portion of the timing margin available to such systems and thus impairs system performance.

Thus, it would be desirable to have a charge pump circuit that is able to reduce current mismatch in a phase-locked state.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures.

DETAILED DESCRIPTION OF THE INVENTION

Figure 1:
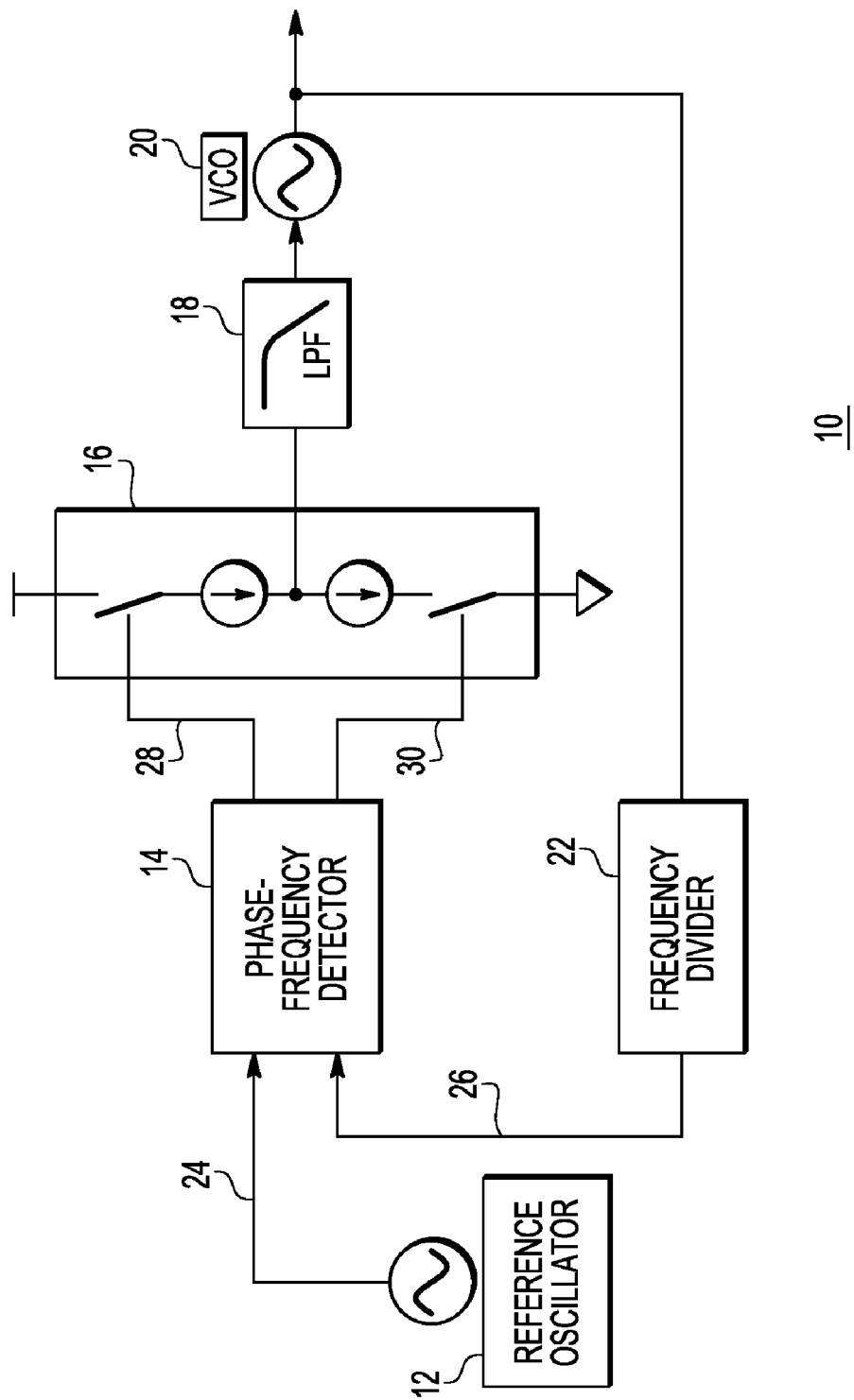
FIG. 1 is a schematic block diagram of a charge pump phase locked loop (PLL) in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention.

The present invention is directed to a charge pump including a charge pump core circuit having a first current source transistor, a second current source transistor and an output terminal, and a replica bias circuit having a first reference current source transistor, a second reference current source transistor and a reference node corresponding to the output terminal of the charge pump core circuit. The reference node is connected to gates of the second current source transistor and the second reference current source transistor. A first input of a regulator circuit is connected to the output terminal of the charge pump core circuit. A second input of the regulator circuit is connected to the reference node of the replica bias circuit. An output of the regulator circuit is connected to gates of the first current source transistor and the first reference current source transistor. As is understood by those of skill in the art, each of the transistors includes a source, a drain and a gate. The transistors may also include a bulk terminal. Unless noted otherwise, the bulk terminal is connected to the source.

The present invention is also directed to a charge pump for a self-biased phase locked loop (PLL) including a charge pump core circuit having a first current source transistor, a second current source transistor and an output terminal, and a replica bias circuit having a first reference current source transistor, a second reference current source transistor and a reference node corresponding to the output terminal of the charge pump core circuit. The reference node is connected to gates of the second current source transistor and the second reference current source transistor. A first input of a differential amplifier circuit is connected to the output terminal of the charge pump core circuit. A second input of the differential amplifier circuit is connected to the reference node of the replica bias circuit. An output of the differential amplifier circuit is connected to gates of the first current source transistor and the first reference current source transistor. A load of the differential amplifier circuit is configured in a cascode current mirror configuration.

The present invention is further directed to a phase locked loop (PLL) including a phase-frequency detector and a charge pump coupled to an output of the phase-frequency detector. The charge pump includes a charge pump core circuit having a first current source transistor, a second current source transistor and an output terminal, and a replica bias circuit having a first reference current source transistor, a second reference current source transistor and a reference node corresponding to the output terminal of the charge pump core circuit. The reference node is connected to gates of the second current source transistor and the second reference current source transistor. A first input of a regulator circuit is connected to the output terminal of the charge pump core circuit. A second input of the regulator circuit is connected to the reference node of the replica bias circuit. An output of the regulator circuit is connected to gates of the first current source transistor and the first reference current source transistor. A filter is coupled to the output terminal of the charge pump, and a voltage-controlled oscillator (VCO) is coupled to the filter.

The charge pump circuit of the present invention has several advantages. In particular, the charge pump circuit of the present invention effectively reduces mismatch in source and sink currents to very low or negligible levels and thus greatly reduces skew or phase offset between a reference clock and a feedback clock of a phase locked loop (PLL).

Referring now to FIG. 1, a charge pump phase locked loop (PLL) 10 is shown. The PLL 10 includes a reference oscillator 12, a phase-frequency detector 14 coupled to the reference oscillator 12, a charge pump 16 coupled to an output of the phase-frequency detector 14, a low-pass filter (LPF) 18 coupled to an output of the charge pump 16, a voltage-controlled oscillator (VCO) 20 coupled to the low-pass filter 18, and a frequency divider 22 coupled between the VCO 20 and the phase-frequency detector 14.

The phase-frequency detector 14 is configured to receive a reference signal 24 from the reference oscillator 12 and a feedback signal 26 from the VCO 20. The phase-frequency detector 14 compares the reference signal 24 with the feedback signal 26 to determine whether a phase (or frequency) difference exists between the reference signal 24 and the feedback signal 26.

When the phase of the reference signal 24 leads the phase of the feedback signal 26, the charge pump 16 receives an Up signal 28 (later referred to as UP) from the phase-frequency detector 14 and outputs a charge (or source) current $I_{source}$ to the low-pass filter 18. When the phase of the reference signal 24 lags the phase of the feedback signal 26, the charge pump 16 receives a Down signal 30 (later referred to as DN) from the phase-frequency detector 14 and a sink current $I_{sink}$ from the low-pass filter 18.

The VCO 20 is biased with a control voltage across the low-pass filter 18. In the embodiment shown, an output of the VCO 20 is fed back through the frequency divider 22 to the phase-frequency detector 14. However, it should be understood by those of ordinary skill in the art that the present invention is not limited to PLLs that employ frequency dividers. In an alternative embodiment, the output of the VCO 20 may be directly fed back to the phase-frequency detector 14 without passing through a frequency divider.

The reference oscillator 12, the phase-frequency detector 14, the low-pass filter 18, the VCO 20 and the frequency divider 22 are well known to those of ordinary skill in the art. Accordingly, detailed description of these components is not required for a complete understanding of the present invention. The charge pump 16, however, will be described in greater detail below with reference to FIG. 2.

Figure 2:
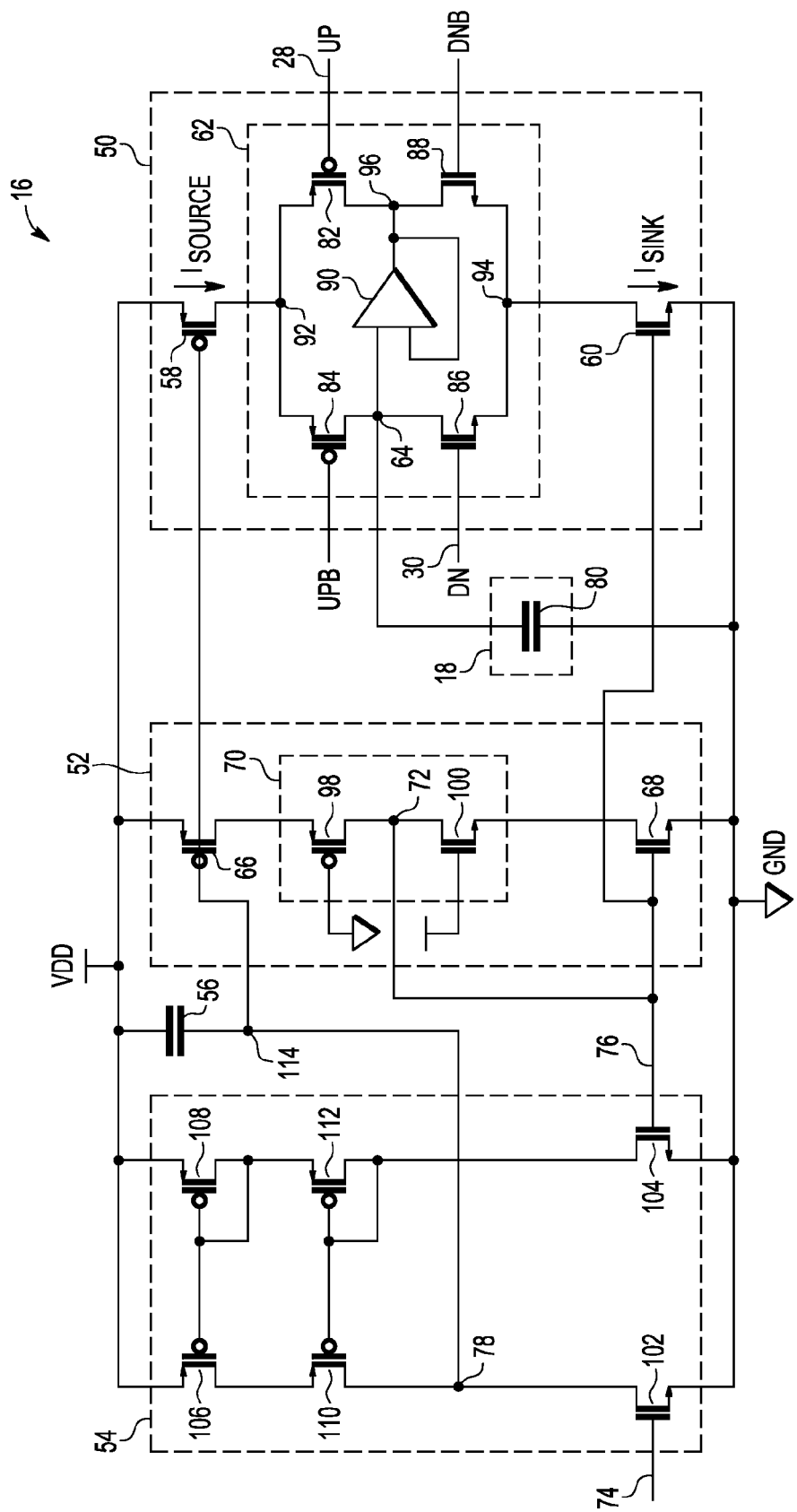
FIG. 2 is a schematic circuit diagram of a charge pump circuit for the PLL of FIG. 1 in accordance with an embodiment of the present invention.

Referring now to FIG. 2, a schematic circuit diagram of the charge pump 16 is shown. The charge pump 16 includes a charge pump core circuit 50, a replica bias circuit 52, a regulator circuit 54, and a compensation capacitor 56. The charge pump core circuit 50 includes a first current source transistor 58, a second current source transistor 60, switching circuitry 62, and an output terminal 64.

The replica bias circuit 52 includes a first reference current source 66, a second reference current source 68, a dummy circuit 70, and a reference node 72 corresponding to the output terminal 64 of the charge pump core circuit 50 and connected to gates of the second current source transistor 60 and the second reference current source transistor 68.

A first input 74 of the regulator circuit 54 is connected to the output terminal 64 of the charge pump core circuit 50, and a second input 76 of the regulator circuit 54 is connected to the reference node 72 of the replica bias circuit 52. An output 78 of the regulator circuit 54 is connected to gates of the first current source transistor 58 and the first reference current source transistor 66.

Also shown in FIG. 2 is the low-pass filter 18 of FIG. 1, which includes a capacitor 80 to which the current $I_{source}$ is sourced or from which current $I_{sink}$ is sinked.

In the embodiment shown, the first current source transistor 58 comprises a first p-channel transistor having a source connected to a supply voltage VDD and a drain connected to the switching circuitry 62, and the second current source transistor 60 comprises a first n-channel transistor having a source connected to ground and a drain connected to the switching circuitry 62.

In the present embodiment, the switching circuitry 62 includes a second p-channel transistor 82, a third p-channel transistor 84, a second n-channel transistor 86 and a third n-channel transistor 88 in a symmetrical arrangement, and a unity gain operational amplifier 90. Gates of the second p-channel transistor 82, the third p-channel transistor 84, the second n-channel transistor 86 and the third n-channel transistor 88 are respectively switched by signals up (UP), up bar (UPB), down (DN) and down bar (DNB), which are output from the phase-frequency detector 14 of the PLL 10 shown in FIG. 1. (As is understood by those of skill in the art, the term "bar" means logical NOT. Sources of the second and third p-channel transistors 82 and 84 are connected to the drain of the first current source transistor 58 at node 92, and sources of the second and third n-channel transistors 86 and 88 are connected to the drain of the second current source transistor 60 at node 94. A drain of the second p-channel transistor 82 is connected to a drain of the third n-channel transistor 88 at node 96, and a drain of the third p-channel transistor 84 is connected to a drain of the second n-channel transistor 86 at the output terminal 64. The output terminal 64 is also connected to a first input of the unity gain operational amplifier 90. An output of the unity gain operational amplifier 90 is connected to the drains of the second p-channel transistor 82 and the third n-channel transistor 88 at the node 96, and is additionally fed back as a second input to the unity gain operational amplifier 90. Accordingly, any change in the control voltage $V_{ctrl}$ at the output terminal 64 is passed on to the output of the unity gain operational amplifier 90.

In the embodiment shown, the first reference current source transistor 66 comprises a fourth p-channel transistor having a source connected to the supply voltage VDD and a drain connected to the dummy circuit 70, and the second reference current source transistor 68 comprises a fourth n-channel transistor having a source connected to ground, a drain connected to the dummy circuit 70, and a gate connected to the reference node 72 and a gate of the second current source transistor 60.

In the present embodiment, the dummy circuit 70 includes a fifth p-channel transistor 98 and a fifth n-channel transistor 100. A source of the fifth p-channel transistor 98 is connected to the drain of the first reference current source transistor 66, and a source of the fifth n-channel transistor 100 is connected to the drain of the second reference current source transistor 68. A drain of the fifth p-channel transistor 98 is connected to a drain of the fifth n-channel transistor 100 at the reference node 72. A gate of the fifth p-channel transistor 98 is connected to ground, and a gate of the fifth n-channel transistor 100 is connected to the supply voltage VDD. Consequently, the fifth p-channel transistor 98 and the fifth n-channel transistor 100 are both permanently switched on. Accordingly, the second reference current source transistor 68 and the fifth n-channel transistor 100 operate as a diode-connected transistor.

As can be seen from FIG. 2, elements of the replica bias circuit 52 are connected in series. Consequently, the same current flows through each of the elements of the replica bias circuit 52.

The respective voltage drops across elements of the replica bias circuit 52 are mirrored across corresponding elements in the charge pump core circuit 50. That is, the drain-to-source voltage ($V_{DS}$) of the first reference current source transistor 66 is mirrored across the first current source transistor 58, the $V_{DS}$ of the second reference current source transistor 68 is mirrored across the second current source transistor 60, and the dummy circuit 70 is configured to mirror a corresponding voltage drop across the switching circuitry 62 in the charge pump core circuit 50. Accordingly, the sizes of the first and second current source transistors 58 and 60 and the transistors 82, 84, 86 and 88 in the switching circuitry 62 are respectively in a predetermined proportion to the sizes of the first and second reference current source transistors 66 and 68 and the transistors 98 and 100 in the dummy circuit 70. For example, if the current mirror ratio between the first reference current source transistor 66 and the first current source transistor 58 is 1:M, then the size of the first current source transistor 58 is M times the size of the first reference current source transistor 66, the sizes of the second and third p-channel transistors 82 and 84 are M times the size of the fifth p-channel transistor 98, the sizes of second and third n-channel transistors 86 and 88 are M times the size of the fifth n-channel transistor 100, and the size of the second current source transistor 60 is M times the size of the second reference current source transistor 68.

Consequently, because the gates of the first current source transistor 58 and the first reference current source transistor 66 are connected and likewise the gates of the second current source transistor 60 and the second reference current source transistor 68 are connected, the first current source transistor 58 and the first reference current source transistor 66 share the same gate-to-source voltage and likewise the second current source transistor 60 and the second reference current source transistor 68 share the same gate-to-source voltage. Therefore, the current flow through the replica bias circuit 52 is mirrored in the charge pump core circuit 50. This reduces or eliminates the difference between the current $I_{source}$ flowing through the first current source transistor 58 and the current $I_{sink}$ flowing through the second current source transistor 60, thereby reducing or eliminating current mismatch in the charge pump 16.

In the present embodiment, the current mirror ratio is 1:1. That is, the first current source transistor 58 and the first reference current source transistor 66 are of the same size, and the second current source transistor 60 and the second reference current source transistor 68 are of the same size. Likewise, the second, third and fifth p-channel transistors 82, 84 and 98 are of the same size, as are the second, third and fifth n-channel transistors 86, 88 and 100.

In the embodiment shown, the regulator circuit 54 comprises a differential amplifier circuit without a tail current source and a load of the differential amplifier circuit is configured in a cascode current mirror configuration. Specifically, the regulator circuit 54 includes a sixth n-channel transistor 102, a seventh n-channel transistor 104, a sixth p-channel transistor 106, a seventh p-channel transistor 108, an eighth p-channel transistor 110 and a ninth p-channel transistor 112.

A gate of the sixth n-channel transistor 102 is connected to the first input 74, and a gate of the seventh n-channel transistor 104 is connected to the reference node 72. Sources of the sixth and seventh n-channel transistors 102 and 104 are connected to ground, and sources of the sixth and seventh p-channel transistors 106 and 108 are connected to the supply voltage VDD. Gates of the sixth and seventh p-channel transistors 106 and 108 are connected to one another and to the drain of the seventh p-channel transistor 108, and gates of the eighth and ninth p-channel transistors 110 and 112 are connected to one another and to the drain of the ninth p-channel transistor 112. A drain of the sixth p-channel transistor 106 is connected to a source of the eighth p-channel transistor 110, and a drain of the seventh p-channel transistor 108 is connected to a source of the ninth p-channel transistor 112. A drain of the eighth p-channel transistor 110 is connected to a drain of the sixth n-channel transistor 102 at the output 78 of the regulator circuit 54, and a drain of the ninth p-channel transistor 112 is connected to a drain of the seventh n-channel transistor 104. Nevertheless, it should be understood by those of ordinary skill in the art that the regulator circuit 54 of the present invention is not limited to a differential amplifier circuit or to a differential amplifier circuit having a load configured in a cascode current mirror configuration. For example, the regulator circuit 54 may comprise an operational amplifier circuit or a differential amplifier circuit without a cascode current mirror.

Use of a differential amplifier circuit without a tail current source is advantageous as it lowers the voltage level required to turn on the sixth and seventh n-channel transistors 102 and 104. Nevertheless, it should be understood by those of ordinary skill in the art that the present invention is not limited to a differential amplifier circuit without a tail current source. A differential amplifier circuit with a tail current source may be used in an alternative embodiment.

Advantageously, the cascode configuration increases the gain of the differential amplifier circuit by increasing the output impedance of the differential amplifier circuit. In one embodiment, the differential amplifier circuit may have a gain greater than about 40 decibels (dB). However, as will be understood by those of ordinary skill in the art, the present invention is not limited by the gain of the differential amplifier circuit.

The differential amplifier employed in the regulator circuit 54 has low common mode gain and high differential gain. Consequently, power supply variations are effectively suppressed with the differential amplifier of the regulator circuit 54.

In the embodiment shown, a first plate of the compensation capacitor 56 is coupled to the supply voltage VDD. A second plate of the compensation capacitor 56 is coupled at node 114 to the gates of the first current source transistor 58 and the first reference current source transistor 66, and to the output 78 of the regulator circuit 54. The compensation capacitor 56 is configured to stabilize the feedback loop in the charge pump circuit 16. Advantageously, because the charge pump circuit 16 contains only one dominant pole, that is, at the output 78 of the regulator circuit 54, only a very low capacitance value, typically on the order of between about 2 picofarads (pF) and about 10 pF is required to stabilize the charge pump circuit 16. This reduces the area requirements of the charge pump circuit 16 and, consequently, the overall module size.

Having described the various components of the charge pump circuit 16, the operation of the charge pump circuit 16 will be described hereinafter. As will be evident from the description below, the charge pump circuit 16 has an overall negative feedback effect that keeps the complete feedback loop stable.

The charge pump circuit 16 of the present embodiment may be applied in a self-biased PLL. In self-biased PLLs, the bandwidth of the PLL is made proportional to the reference frequency by making the charge pump current ($I_{CP}$) proportional to the control voltage ($V_{ctrl}$). Accordingly, the charge pump current ($I_{CP}$) may be represented by the following equation (1):

$$\Delta I_{CP} = gm * \Delta Vctrl \tag{1}$$

where gm represents the transconductance of the sixth n-channel transistor 102. Thus, $I_{CP}$ varies in accordance with $V_{ctrl}$ and adjusts the PLL bandwidth.

If $I_{source}$ and $I_{sink}$ are not equal when the PLL 10 enters a phase-locked state, a change in control voltage $V_{ctrl}$ at the output terminal 64 results, as described by the following equation (2):

$$\Delta V_{ctrl} = \frac{I_{diff}}{C_{lpf}} * \Delta t \tag{2}$$

where $\Delta V_{ctrl}$ represents the change in the control voltage $V_{ctrl}$ at the output terminal 64, $I_{diff}$ represents the difference between $I_{source}$ and $I_{sink}$, $\Delta t$ represents the duration in which both the source and sink switches in the switching circuitry 62 are simultaneously turned on, and $C_{lpf}$ represents the capacitance of the capacitor 80 of the low-pass filter 18.

If $I_{sink}$ is greater than $I_{source}$, the control voltage $V_{ctrl}$ at the output terminal 64 falls and the difference between the first and second inputs 74 and 76 to the regulator circuit 54 changes, as represented by the following equation (3):

$$\Delta V_{in} = V_{ctrl} - V_{nbias} \tag{3}$$

where $\Delta V_{in}$ represents the difference between the first and second inputs 74 and 76 to the regulator circuit 54, $V_{ctrl}$ represents the control voltage at the output terminal 64, and $V_{nbias}$ represents the voltage at reference node 72.

Initially, $\Delta V_{in}$ is negative because the control voltage $V_{ctrl}$ at the output terminal 64 falls to a greater extent than the voltage $V_{nbias}$ at reference node 72. Consequently, the voltage at output node 78 increases and, accordingly, currents through the first current source transistor 58 and the first reference current source transistor 66 decrease.

When the potential at the output node 78 increases by $\Delta V$, both the control voltage $V_{ctrl}$ at the output terminal 64 and the voltage $V_{nbias}$ at the reference node 72 go down.

The change in the control voltage $V_{ctrl}$ may be represented by the following equation (4):

$$\Delta V_{ctrl} = \Delta V \cdot \left(gmp58 - \frac{gmp66}{gmn68} \cdot gmn60\right) \cdot Req \quad (4)$$

where $\Delta V_{ctrl}$ represents the change in the control voltage $V_{ctrl}$, $\Delta V$ represents the change in the voltage at the output node 78, gmp58 and gmn60 represent the transconductances of the first current source transistor 58 and the second current source transistor 60, respectively, gmp66 and gmn68 represent the transconductances of the first reference current source transistor 66 and the second reference current source transistor 68, respectively, $\Delta V \cdot gmp58$ represents the change in the current flowing through the first current source transistor 58, $$\Delta V \cdot \frac{gmp66}{gmn68} \cdot gmn60$$

represents the change in the current flowing through the second current source transistor 60, and Req represents the effective equivalent resistance at the output terminal 64. The effective equivalent resistance Req at the output terminal 64 may be represented by the following equation (5):

$$Req = (Rmp58 + Rmps84) \| (Rmn60 + Rmns86) \quad (5)$$

where Rmp58, Rmps84, Rmn60 and Rmns86 represent the drain-to-source resistances of the first current source transistor 58, the third p-channel transistor 84, the second current source transistor 60 and the second n-channel transistor 86, respectively.

The change in the voltage $V_{nbias}$ at the reference node 72 may be represented by the following equation (6):

$$\Delta V_{nbias} = \Delta V \cdot (gmp66/gmn68) \quad (6)$$

where $\Delta V_{nbias}$ represents the change in the voltage at the reference node 72, $\Delta V$ represents the change in the voltage at the output node 78, gmp66 represents the transconductance of the first reference current source transistor 66, $\Delta V \cdot gmp66$ represents the change in the current flowing through the first reference current source transistor 66, gmn68 represents the transconductance of the second reference current source transistor 68, and (1/gmn68) represents the effective resistance at the reference node 72 since the second reference current source transistor 68 is effectively a diode-connected transistor.

If the transconductances gmp58, gmp66, gmn68 and gmn60 are selected such that gmp58 and gmn60 are approximately equal and gmp66 and gmn68 are approximately equal, then according to equation (4), $\Delta V_{ctrl}$ approaches zero and according to equation (6), $\Delta V_{nbias}$ is close to $\Delta V$.

Although both the control voltage $V_{ctrl}$ at the output terminal 64 and the voltage $V_{nbias}$ at the reference node 72 go down when the potential at the output node 78 increases by $\Delta V$, the voltage $V_{nbias}$ at the reference node 72 goes down lower as compared to control voltage $V_{ctrl}$ because the change in the current going out of the output terminal 64

$$\left(i.e., \Delta V \cdot \left(gmp58 - \frac{gmp66}{gmn68} \cdot gmn60\right)\right)$$

is very small. Consequently, less current flows through the seventh n-channel transistor 104 as compared to the sixth n-channel transistor 102.

Due to the current mirroring action in the regulator circuit 54, the currents flowing through the sixth and seventh p-channel transistors 106 and 108 equalize and, consequently, ignoring the channel length modulation effect, the gate voltages of the sixth and seventh n-channel transistors 102 and 104 (i.e., $V_{ctrl}$ and $V_{nbias}$) also equalize. The current flowing through the seventh n-channel transistor 104 is mirrored in the sixth and eighth p-channel transistors 106 and 110 due to the cascode current mirror configuration in the differential amplifier circuit. Consequently, the output node 78 is pulled down due to the lower current flowing in the sixth and eighth p-channel transistors 106 and 110 as compared to the current flowing through the sixth n-channel transistor 102.

Because the fall in the voltage $V_{nbias}$ at the reference node 72 is greater than the reduction in the control voltage $V_{ctrl}$ when the current through the first reference current source transistor 66 is reduced, $\Delta V_{in}$ becomes positive. Consequently, the potential at the output node 78 decreases, and accordingly the currents through the first current source transistor 58 and the first reference current source transistor 66 increase.

The above described settling process continues until a steady state in which the control voltage $V_{ctrl}$ equals the voltage $V_{nbias}$ at the reference node 72 is attained. When this happens, the drain-to-source voltages $V_{DS}$ of the second current source transistor 60 and the second reference current source transistor 68 also become equal since the sizes of the second n-channel transistor 86 and the fifth n-channel transistor 100 are the same and therefore carry the same current. Accordingly, the current through the second current source transistor 60 also becomes substantially identical to the current through the second reference current source transistor 68.

Similarly, the drain-to-source voltages $V_{DS}$ of the first current source transistor 58 and the first reference current source transistor 66 also become equal since the sizes of the third p-channel transistor 84 and the fifth p-channel transistor 98 are the same and therefore carry the same current. Accordingly, the current through the first current source transistor 58 also becomes substantially identical to the current through the first reference current source transistor 66.

Since the currents flowing through the first reference current source transistor 66 and the second reference current transistor 68 are the same and are mirrored in the first current source transistor 58 and the second current source transistor 60, the currents flowing through the first current source transistor 58 and the second current source transistor 60 become essentially the same.

The settling process may take several cycles of UP and DN pulses before $I_{source}$ and $I_{sink}$ become equal, depending on the bandwidth of the charge pump circuit 16.

The charge pump circuit 16 effectively reduces the mismatch in the source and sink currents $I_{source}$ and $I_{sink}$ to negligible levels and, thus, greatly reduces the skew or phase offset between the reference clock and the feedback clock of the PLL 10.

Likewise, in a converse scenario where $I_{source}$ is greater than $I_{sink}$, $\Delta V_{in}$ becomes positive initially according to equation (3). The potential at the output node 78 decreases by $\Delta V$, and the control voltage $V_{ctrl}$ at the output terminal 64 and the voltage $V_{nbias}$ at the reference node 72 go up. However, the voltage $V_{nbias}$ at the reference node 72 goes up more than the control voltage $V_{ctrl}$. Accordingly, less current flows through the sixth n-channel transistor 102 as compared to the sixth and eighth p-channel transistors 106 and 110, and the output node 78 is pulled high again. Eventually, the charge pump circuit 16 again stabilizes in a state in which both $I_{source}$ and $I_{sink}$ are equal.

In the charge pump circuit 16, the control voltage $V_{ctrl}$ and the voltage $V_{nbias}$ at the reference node 72 become equal because of the current mirroring action of the sixth, seventh, eighth and ninth p-channel transistors 106, 108, 110 and 112. Accordingly, the overall circuit operates in a current mode, that is, the currents are equalized first and this forces equalization of the voltages. For this reason, there is no need of a tail current source in the regulator circuit 54; the gate-to-source voltages of the sixth n-channel transistor 102 and the seventh n-channel transistor 104 become equal even without a tail current source. This simplifies the design of the differential amplifier circuit. The simplicity of the circuit architecture makes the charge pump circuit 16 robust.

The charge pump circuit 16 is technology independent and may, for example, be implemented with bi-polar junction transistors (BJTs) in an alternative embodiment. Further, the charge pump circuit 16 is generic in nature and can be implemented, for example, in all complementary metal-oxide semiconductor (CMOS) process technologies.

The description of the preferred embodiment of the present invention has been presented for purposes of illustration and description, but is not intended to be exhaustive or to limit the invention to the form disclosed. It will be appreciated by those skilled in the art that changes could be made to the embodiment described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A charge pump, comprising:
   a charge pump core circuit having a first current source transistor, a second current source transistor, and an output terminal;
   a replica bias circuit having a first reference current source transistor, a second reference current source transistor connected in series with the first reference current source transistor, a dummy circuit connected between the first and second reference current source transistors, and a reference node corresponding to the output terminal of the charge pump core circuit, wherein the reference node is connected to gates of the second current source transistor and the second reference current source transistor; and
   a regulator circuit having a first input connected to the output terminal of the charge pump core circuit, a second input connected to the reference node of the replica bias circuit, and an output connected to gates of the first current source transistor and the first reference current source transistor, and
   wherein the dummy circuit comprises a first PMOS transistor connected in series with a first NMOS transistor, and wherein the dummy circuit mirrors a corresponding voltage drop across switching circuitry in the charge pump core circuit.

2. The charge pump of claim 1, wherein the regulator circuit comprises a differential amplifier circuit.

3. The charge pump of claim 2, wherein the differential amplifier circuit has a gain greater than about 40 decibels (dB).

4. The charge pump of claim 2, wherein a load of the differential amplifier circuit is configured in a cascode configuration.

5. The charge pump of claim 4, wherein the load of the differential amplifier circuit is configured in a cascode current mirror configuration.

6. The charge pump of claim 2, wherein the differential amplifier circuit is without a tail current source.

7. The charge pump of claim 1, further comprising a capacitor coupled to the output of the regulator circuit.

8. The charge pump of claim 7, wherein the capacitor has a capacitance of between about 2 picofarads (pF) and about 10 pF.

9. A phase locked loop (PLL), comprising:
   a phase-frequency detector;
   a charge pump coupled to an output of the phase-frequency detector, the charge pump comprising:
      a charge pump core circuit having a first current source transistor, a second current source transistor, and an output terminal;
      a replica bias circuit having a first reference current source transistor, a second reference current source transistor connected in series with the first reference current source transistor, a dummy circuit connected between the first and second reference current source transistors, and a reference node corresponding to the output terminal of the charge pump core circuit, wherein the reference node is connected to gates of the second current source transistor and the second reference current source transistor; and
      a regulator circuit having a first input connected to the output terminal of the charge pump core circuit, a second input connected to the reference node of the replica bias circuit, and an output connected to gates of the first current source transistor and the first reference current source transistor, and
      wherein the dummy circuit comprises a first PMOS transistor connected in series with a first NMOS transistor, and wherein the dummy circuit mirrors a corresponding voltage drop across switching circuitry in the charge pump core circuit;
   a filter coupled to the output terminal of the charge pump; and
   a voltage-controlled oscillator (VCO) coupled to the filter.

10. The PLL of claim 9, wherein the regulator circuit comprises a differential amplifier circuit having a gain greater than about 40 decibels (dB).

11. The PLL of claim 10, wherein a load of the differential amplifier circuit is configured in a cascode current mirror configuration.

12. A charge pump, comprising:
   a charge pump core circuit having a first current source transistor, a second current source transistor connected in series with the first current source transistor, a switching circuit connected between the first and second current source transistors, and an output terminal;
   a replica bias circuit having a first reference current source transistor, a second reference current source transistor connected in series with the first reference current source, a dummy circuit connected between the first and second reference current source transistors, and a reference node corresponding to the output terminal of the charge pump core circuit, wherein the reference node is connected to gates of the second current source transistor and the second reference current source transistor; and a regulator circuit having a first input connected to the output terminal of the charge pump core circuit, a second input connected to the reference node of the replica bias circuit, and an output connected to gates of the first current source transistor and the first reference current source transistor; and wherein the switching circuit comprises,
- a first PMOS transistor connected in series with a first NMOS transistor, wherein a drain of the first current source transistor is connected to a source of the first PMOS transistor and a drain of the second current source transistor is connected to a source of the first NMOS transistor;
- a second PMOS transistor connected in series with a second NMOS transistor, wherein a drain of the first current source transistor is connected to a source of the second PMOS transistor and a drain of the second current source transistor is connected to a source of the second NMOS transistor; and
- an operational amplifier having a first input connected to the output terminal and an output connected to a node between the first PMOS transistor and the first NMOS transistor, and to a second input of the operational amplifier.

13. The charge pump of claim 12, wherein the dummy circuit comprises:
- a third PMOS transistor having a source connected to a drain of the first reference current source; and
- a third NMOS transistor connected in series with the third PMOS transistor and having a source connected to a drain of the second reference current source; and
- wherein the reference node is located at a connection between the third PMOS and third NMOS transistors.

14. The charge pump circuit of claim 13, further comprising a low pass filter connected between the output terminal and the first input of the regulator circuit.

15. The charge pump circuit of claim 13, further comprising a compensation capacitor connected between the output of the regulator circuit and a common supply voltage (VDD).

* * * * *